(12) United States Patent
Heigl

(10) Patent No.: US 6,401,909 B2
(45) Date of Patent: *Jun. 11, 2002

(54) COMPONENT PICKER

(76) Inventor: Helmuth Heigl, Anemonenstr. 3a, D-83059 Kolbermoor (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/332,076
(22) Filed: Jun. 14, 1999
(30) Foreign Application Priority Data Jun. 19, 1998 (DE) .......................... 198 27 458

(51) Int. Cl.⁷ ..................... B65G 47/14; B65G 47/08
(52) U.S. Cl. ..................... 198/468.6; 198/532
(58) Field of Search .......... 198/468.6, 468.8, 198/463.6, 493, 532; 406/79, 115, 144, 146

(56) References Cited

U.S. PATENT DOCUMENTS

| | | | | |
|---|---|---|---|---|
| 2,887,622 A | * | 5/1959 | Rayburn et al. | 209/573 |
| 4,234,418 A | * | 11/1980 | Boissicat | 209/573 |
| 4,406,373 A | * | 9/1983 | Braden | 209/574 |
| 4,588,092 A | * | 5/1986 | Moechnig et al. | 209/573 |
| 4,703,858 A | * | 11/1987 | Ueberreiter et al. | 209/573 |
| 4,724,965 A | * | 2/1988 | Willberg | 209/573 |
| 4,778,063 A | * | 10/1988 | Ueberreiter | 209/573 |
| 5,261,775 A | * | 11/1993 | Kobayashi | 209/573 |
| 5,348,164 A | * | 9/1994 | Heppler | 209/573 |
| 5,680,936 A | * | 10/1997 | Beers | 209/571 |
| 5,934,505 A | * | 8/1999 | Shimada | 198/396 |

FOREIGN PATENT DOCUMENTS

| | | | | |
|---|---|---|---|---|
| DE | 3217531 | * | 11/1983 | |
| DE | 3249418 | * | 4/1984 | |
| DE | 3539973 | | 5/1987 | |
| EP | 0269889 | | 11/1987 | |
| JP | 0037615 | * | 2/1986 | 198/463.6 |
| JP | 002941 | * | 2/1988 | 198/463.6 |
| JP | 0043125 | * | 2/1990 | 198/463.6 |
| JP | 403034553 | * | 2/1991 | 221/298 |
| RU | 1206050 | * | 1/1986 | 221/298 |

OTHER PUBLICATIONS

Advantest Corporation "M3841A Dynamic Test Handler Operation Manual" (1989).

* cited by examiner

Primary Examiner—Robert P. Olszewski
Assistant Examiner—Paul T. Chin
(74) Attorney, Agent, or Firm—Stevens, Davis, Miller & Mosher, LLP

(57) ABSTRACT

The invention relates to a picker for electronic components (24, 25, 26), more particularly for picking and subsequently testing the components (24, 25, 26). The picker has a fixed feed rail (11) for accommodating a plurality of components (24, 25, 26) arranged juxtaposed in a row as well as a conveyor unit (17) arranged at an exit opening (43) of the feed rail (11) and perpendicularly shiftable thereto. The conveyor unit has a window (27) suitable for receiving a single component (24, 25, 26). An impact-controllable stop (14) is provided in the feed rail (11) upstream of the conveyor unit (17) for arresting components (24, 25, 26) accommodated in the feed rail (11). The spacing between the stop (14) and an end of the feed rail (11) facing the conveyor unit (17) is substantially twice the overall length of a component (24, 25, 26). Pressure acting on a single component (24; 25; 26) arranged in the conveyor window (27) is reduced.

13 Claims, 5 Drawing Sheets

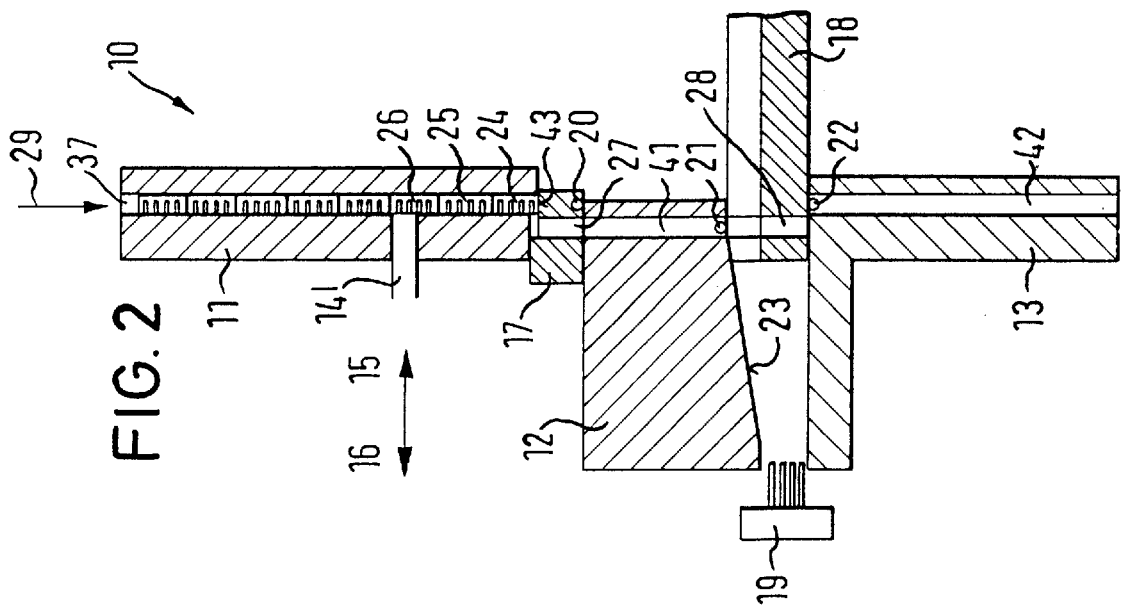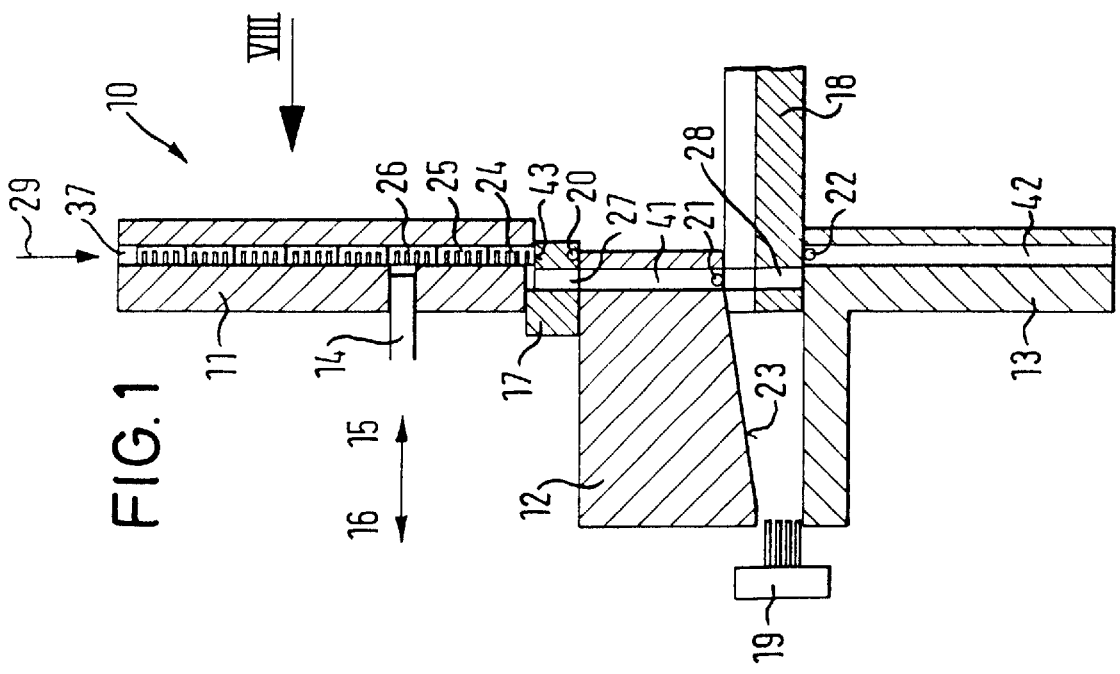

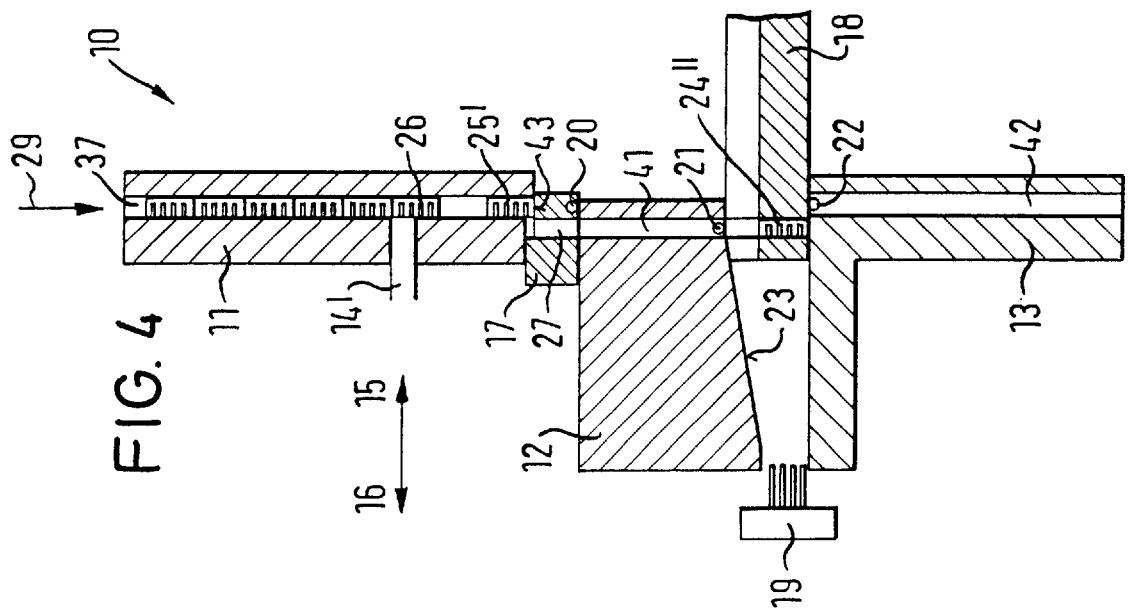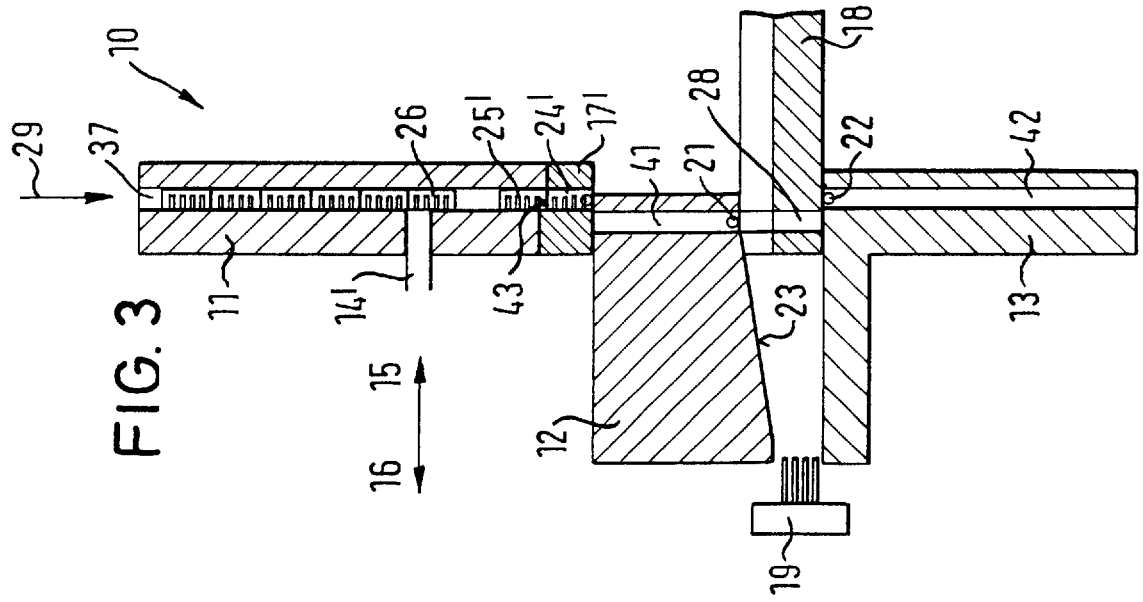

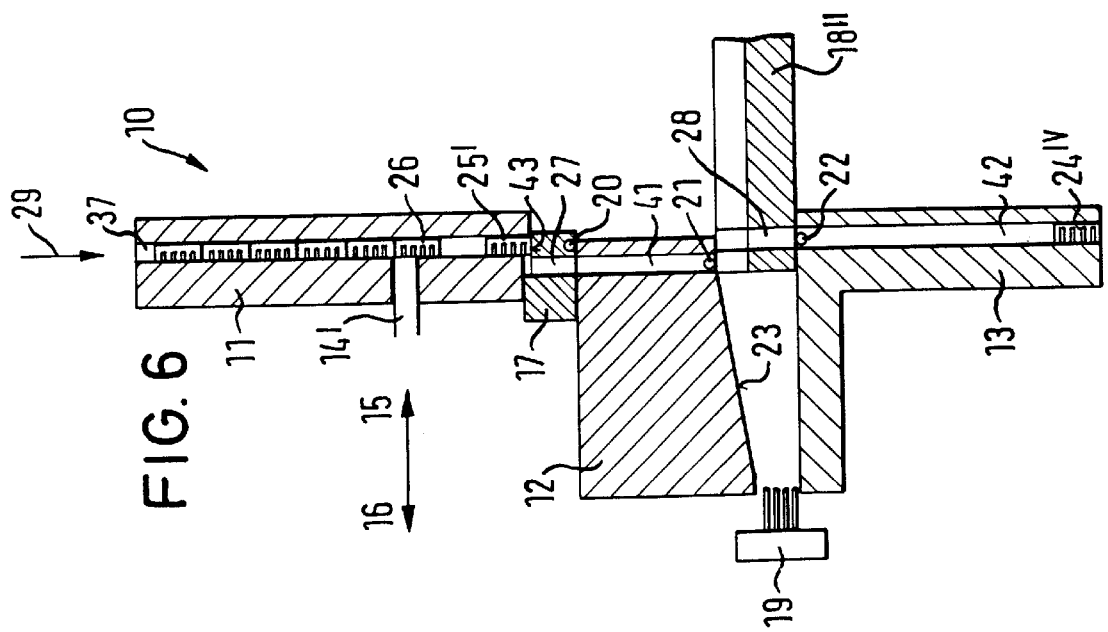
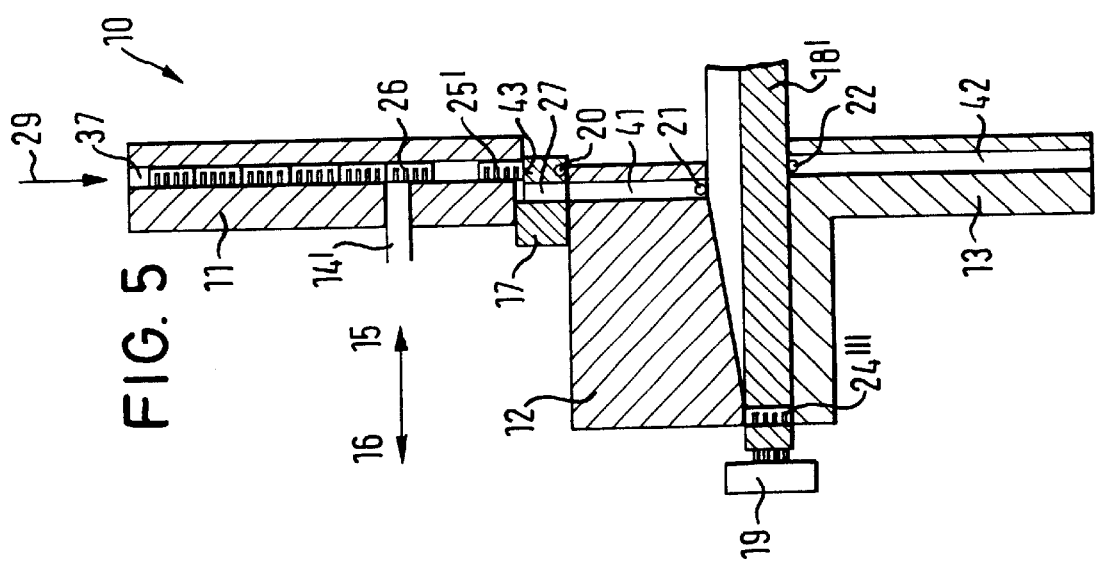

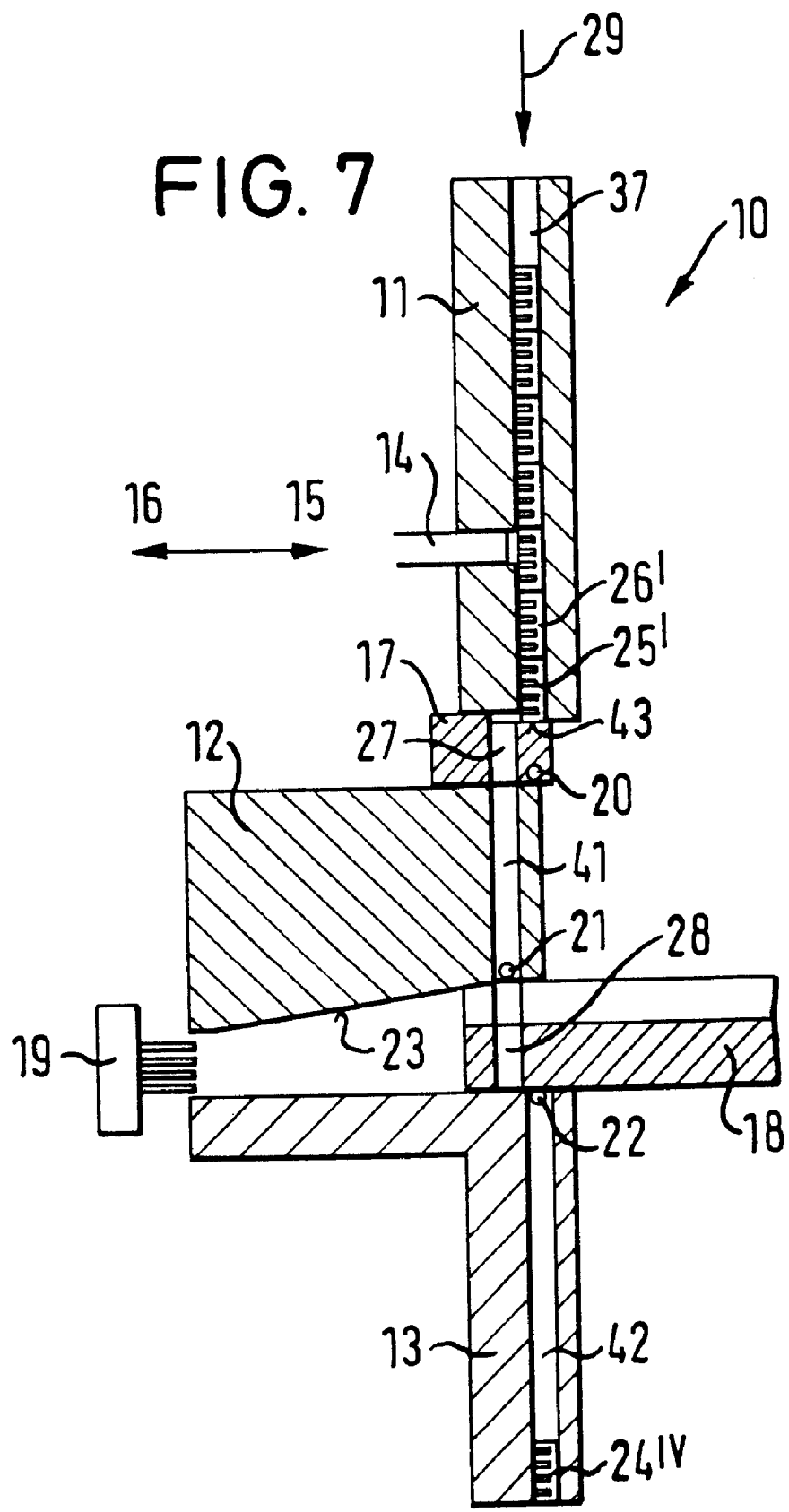

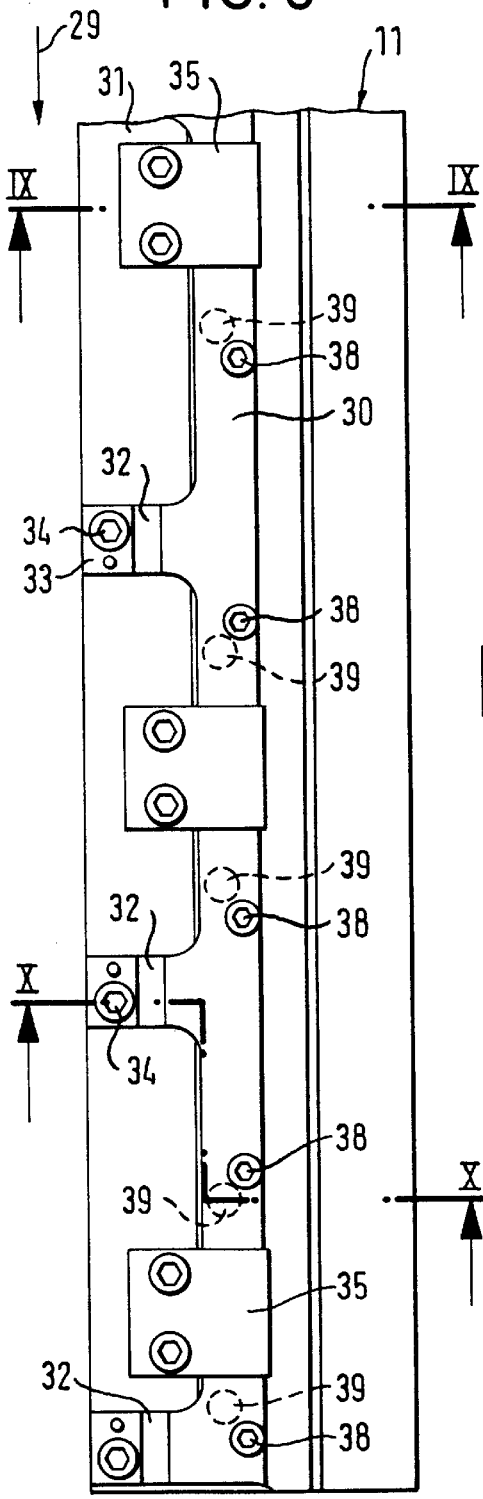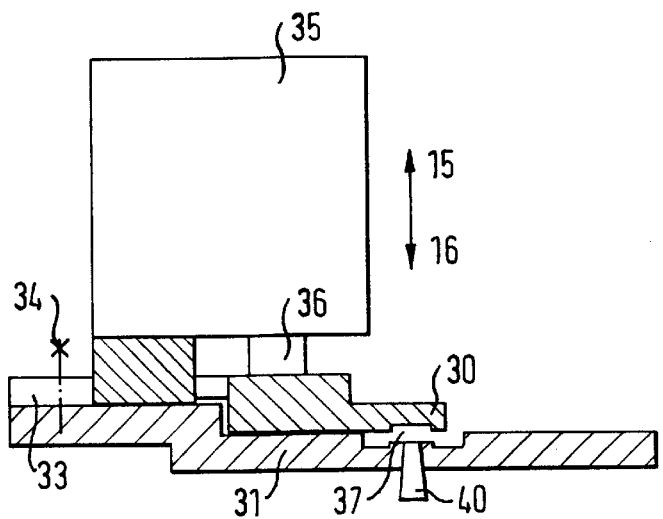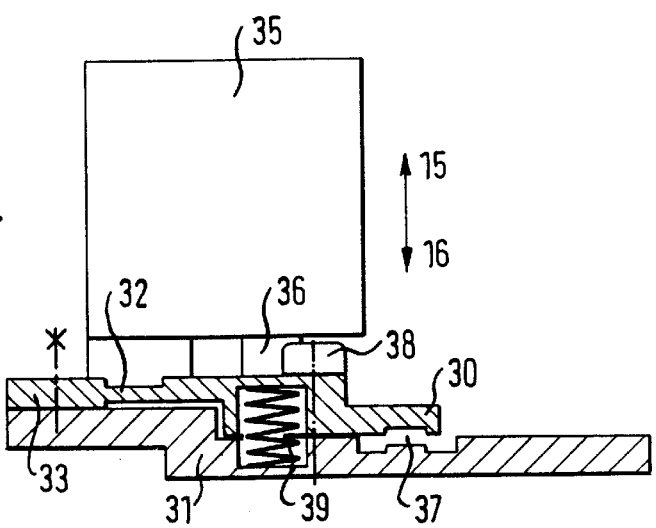

COMPONENT PICKER

FIELD OF THE INVENTION

The present invention relates to a picker for electronic components, more particularly for picking and subsequently testing the components including a feed rail for accommodating a plurality of components arranged juxtaposed in a row.

The picker may be employed in conjunction with electronic components of various kinds, more particularly integrated circuits.

BACKGROUND OF THE INVENTION

One such picker is known from DE 35 39 973 A1. This known picker comprises a pivotable feed rail accommodating a row of components to be tested. The bottom-most component in each case is tested while still being within the feed rail, it resting thereby on a fixed support plate. On completion of testing the feed rail is pivoted, causing the bottom-most component to slide on the support plate. Provided in the pivoting direction of the feed rail is a spring-loaded retaining pin which penetrates an opening in the feed rail on pivoting and comes into contact with the second component In further pivoting the bottom-most component passes over the edge of the support plate and is output downwards into a further rail, The further components accommodated in the feed rail are arrested by the retaining pin. On pivoting return of the feed rail the retaining pin releases the retained component which slips downwards into the feed rail and comes to rest on the support plate. This second and all further components are tested the same as the first.

This known device works satisfactorily up to certain dimensions of the components to be tested. When picking and testing miniature components there is, however, the risk of contact errors, due to the components being located directly juxtaposed and still to be picked in contacting and testing. Furthermore, speedy picking and testing the components is not possible due to the mass requiring movement being very large.

SUMMARY OF THE INVENTION

It is thus the object of the present invention to provide a picker permitting speedy and reliable picking of even miniature components.

In accordance with the invention this object is achieved in the case of a picker of the aforementioned kind which additionally comprises a conveyor unit arranged at an exit opening of the feed rail and perpendicularly shiftable relative to the feed rail, a window suitable for receiving a single component of the plurality of components, the single component being shiftable together with the conveyor unit when received in the window, and an impact-controllable stop provided in the feed rail upstream of the conveyor unit for arresting components accomodated in the feed rail, wherein the spacing between the stop and an end of the feed rail facing the conveyor unit is substantially twice the overall length of a component.

The shiftable conveyor unit permits use of a fixed feed rail and a reduction in the mass moved. The size of the window in the conveyor unit ensures that only one component at a time can be received, thus achieving reliable picking without requiring any separate arresting means in the conveyor unit, i.e. there being no need for a power supply to the conveyor unit, thus achieving a simple and low-cost design. The impact controllable stop prevents the feed-through of further components onto the bottom-most component accommodated in the window of the conveyor unit, thus reducing the urging force so that the conveyor unit has facilitated movement to thus avoid damage to the components.

The spacing between the stop and the end of the feed rail facing the conveyor unit is substantially twice the overall length of a component, the stop thus parting two components earmarked for picking from the other components accommodated in the feed rail. The urging pressure on the bottom-most component is substantially reduced, but is still sufficient to ensure a reliable insertion into the window of the conveyor unit .

Advantageous further embodiments and aspects of the invention are also disclosed by this specification.

DETAILED DESCRIPTION OF THE PREFERRED EMBODIMENTS

In one advantageous embodiment the conveyor unit is con figured for tolerance compensation higher on one side of the window than on the opposite side, i.e. the conveyor unit is thus configured stepped, the higher side being arranged facing away from the feed rail in the shifting direction. The lower side sweeps the guideway for the components configured in the feed rail in the shifting action of the conveyor unit. During this shifting action the subsequent component in each case is in contact with the surface of the lower side. This tolerance compensation ensures even in the case of fluctuating outer dimensions, especially when the overall length of the component fluctates, that a reliable shift of the conveyor unit is possible. As long as the overall length of the components is located within the side heights of the conveyor unit there is no restriction to the shifting action of the conveyor unit.

In another advantageous aspect a second conveyor unit having a window suitable for receiving a component is provided downstream of the first conveyor unit and capable of being travelled parallel to the first conveyor unit. This second conveyor unit receives a component already picked from the first conveyor unit. This component may then be put through the various steps in processing or testing without influencing the other components contained in the picker.

To advantage a contacting device is provided with which a component held in the second conveyor unit is connectable for testing. This contacting device permits more particularly checking the integrated electronic circuits contained in the component.

In accordance with another advantageous further embodiment a rail is provided offset from the feed rail between the first conveyor unit and the second conveyor unit. This rail causes the components to be guided between the first and second conveyor unit. Offsetting the rail from the feed rail prevents one or more components dropping directly through the window of the first conveyor unit into the rail, thus ensuring reliable picking.

To advantage the travel of the second conveyor unit is greater than the travel of the first conveyor unit. This greater travel permits removal of the picked component from the feed rail and from further components applied to the feed rail. Due to this arrangement a reliable large contacting/tester device may be employed.

In another advantageous further embodiment a ramp is provided along the travel of the second conveyor unit for aligning a component accommodated in the second conveyor unit. In the shifting action of the second conveyor unit the component comes into contact with the ramp by which it is oriented in a predetermined position, as a result of which accuracy in contacting and thus testing the component is even assured when the component is intially wrongly located in the second conveyor unit.

To advantage a discharge rail for receiving and guiding the picked components is provided downstream of the second conveyor unit, this discharge rail being in line with the feed rail. The discharge rail permits reliable component handling and guidance, more particularly in rejecting components on which testing the integrated electronic circuits failed to produce a satisfactory result. Arranging the discharge rail in line with the feed rail enables the components to be input and output in one and the same plane, thus simplifying the design of the picker as a whole and facilitating its integration into an existing host system.

Advantageously at least one photocell is provided for sequence control and sensing the presence of a component, this at least one photocell "seeing" whether a component has been positioned as intended or has left a predetermined position, thus enabling backups in the feed rail or a component jammed in the conveyor unit to be reliable detected and quickly remedied.

In another advantageous further embodiment each photocell is arranged on a fixed part of the picker, the moving parts, more particularly the conveyor units then requiring no power supply, thus enabling the design to be maintained, simple and rugged whilst involving low maintenance and costs.

In accordance with yet another advantageous aspect the feed rail comprises an upper part and a lower part, the spacing between upper part and lower part being variable by means of a signal-controllable positioner, more particularly a pneumatic positioner, thus enabling the guideway formed in the feed rail between upper part and lower part for the components to be varied as required, especially in enabling its headway to be reduced or increased so that any components having become snagged can thus become separated. This arrangement enables backups due to tilting or snagging between the components to be prevented or remedied. Making use of a pneumatic positioner eliminates any formation of magnetic fields or interference electrical fields which could otherwise detriment testing of the electronic components when using electrically actuated positioners.

In still another further embodiment one or more air nozzles are provided for conveying the components. When the feed rail is positioned perpendicularly or inclined the air nozzles are able to assist or, when so required, counteract movement in the conveying direction.

The invention will now be detained by way of an embodiment illustrated schematically in the drawing in which:

FIG. 1 is a longitudinal section through one embodiment of picker in accordance with the invention prior to commencement of picking:

FIGS. 2 to 7 are views as shown in FIG. 1, illustrating various working positions in picking;

FIG. 8 is a side view of that as shown in FIG. 1 in the direction of the arrow VIII.

FIG. 9 is a section taken along the line IX—IX as shown in FIG. 8; and

FIG. 10 is a section taken along the line X—X as shown in FIG. 8.

Referring now to FIGS. 1 to 7 depicting various working positions of a picker 10 it is to be noted that like components are identfied by like reference numerals throughout.

The picker 10 in accordance with the invention comprises a feed rail 11, a further rail 12 as well as a discharge rail 13.

Arranged in the region of the feed rail 11 is a controllable-impact stop 14 shiftable in the direction of the arrow 15, 16. Between the feed rail 11 and the rail 12, i.e. at an exit opening 43 of the feed rail 11 a first conveyor unit 17 is arranged perpendicularly shiftable relative to the feed rail 11 in the direction of the arrow 15, 16. A second conveyor unit 18 is provided between the rail 12 and the discharge rail 13. This conveyor unit 18 is likewise shiftable in the direction of the arrow 15, 16 and thus perpendicular to the feed rail 11 and parallel to the conveyor unit 17. Arranged in the plane of the conveyor unit 18 is a contacting device 19.

The picker 10 comprises furthermore three photocells 20, 21, 22. The first photocell 20 is arranged on a fixed part just above the rail 12. A second photocell is provided within the rail 12 just above the conveyor unit 18. The third photocell 22 is arranged in the discharge rail 13 just below the conveyor unit 18. These photocells 20, 21, 22 serve sequence control and sensing.

The rail 12 comprises on its side facing the conveyor unit 18 a ramp 23. This ramp 23 is partly clasped by the conveyor unit 18 which in its upper portion features a substantially U-shaped cross-section.

Accommodated in the feed rail 11 is a row of components 24, 25, 26. Each of the components 24, 25, 26 is identical to the other. In the example embodiment illustrated the components 24, 25, 26 concerned comprise integrated electronic circuits as well as electric terminals (not shown).

Provided in the conveyor unit 17 is a window 27 suitable for receiving a component 24, 25, 26, the conveyor unit 18 likewise comprising one such window 28. Conveyance of the components 24, 25, 26 through the picker 10 is in the direction of the arrow 29.

The feed rail 11 comprises a guideway 37 arranged offset from a guideway 41 of the rail 12 and in line with a guideway 42 of the discharge rail 13.

The working sequence of the picker 10 will now be described with reference to the FIGS. 1 to 7.

Referring now to FIG. 1 there is illustrated that the components 24, 25, 26 are arranged only in the guideway 37 of the feed rail 11. The stop 14 is retracted in the direction of the arrow 16 and not in contact with the component 26. The conveyor unit 17 too, is travelled to its left-hand position in the direction of the arrow 16. The window 27 is in line with the the guideway 41 of the rail 12 so that the bottom-most component 24 rests on the surface of the conveyor unit 17. The conveyor unit 18 is located in its middle position. In this position the window 28 is in line with the guideway 41 of the rail 12.

For picking, the stop 14 is first urged in the direction of the arrow 15 against the component 26 which is thus arrested in the guideway 37. This arresting action cancels the force exerted by the further components on the two bottom-most components 24, 25. Component 24 thus presses against the surface of the conveyor unit 17 only slightly.

The conveyor unit 17 is then shifted in the direction of the arrow 15 in its position 17' as shown in FIG. 3. The window 27 is in line with the guideway 37 so that components 24, 25 move into the position 24', 25'. The bottom-most component 24' conceals the photocell 20 and produces a corresponding signal indicating the presence of component 24'. Component 24' is then located on the upper side of the rail 12.

The conveyor unit 17 is then retracted in the direction of the arrow 16 into its starting position as shown in FIG. 4. The window 27 is in line with the guideway 41 of the rail 12 so that the component 24 is moved in the direction of the arrow 29 into the window 28 of the conveyor unit 18. In doing so it passes the photocell 21 and produces a signal indicating passage of a component. Component 25' remains substantially in place and is now located on the upper side of the conveyor unit 17 like the component 24 as illustrated before in FIGS. 1 and 2.

Subsequently the conveyor unit 18 is travelled in the direction of the arrow 16, i.e. to the left into its position as shown in FIG. 5, the component 24 thereby being urged by the ramp 23 into the bottommost position in the window 28 and oriented therein, thus assuring that the component 24 is correctly positioned in coming into contact with the contacting device 19. In this position the contacts (not shown) of the component 24 come into contact with the contacting device 19. Electronic circuits integrated in the component 24 can thus be tested reliable with high precision.

The ramp 23 ensures proper orientation of the component 24 even when it has failed to move in the window 28 up to the upper side of the discharge rail 13, it instead having become jammed or snagged previously. Any movement of the component 24 directly into the guideway 42 of the discharge rail 13 is prevented by the rail 12 being offset from the discharge rail 13.

The component 24 is supported by the upper side of the discharge rail 13 during shifting of the conveyor unit 18. The discharge rail 13 is configured sufficiently long to ensure support up to the contacting device 19.

On completion of testing, the conveyor unit 18 travels in the direction of the arrow 15 into its outermost right-hand position 18" as evident from FIG. 6. The window 28 is in line with the guideway 42 of the discharge rail 13 so that the component 24 is moved in the direction IV of the arrow 28 into its position 24, thereby concealing the photocell 22 which accordingly produces a signal indicating passage of a component. The component 24 is subsequently removed from the discharge rail 13 and supplied to further steps in processing or rejected, depending on the results of testing the integrated electronic circuits.

This is followed by picking and contacting the component 25. This component 25 may be picked and tested either with the stop 14 still urged in contact, just like the component 24, or, as an alternative the stop 14 may be lifted off in the direction of the arrow 16 from the component 26. The components 26 in the feed rail 11 follow through to assume the position as shown in FIG. 7. Subsequently the stop 14 is re-urged in the direction of the arrow 15, as already described above, and the component 25 picked as already described relative to the component 24.

It is not a mandatory requirement that the conveyor unit 17 is not shifted into its right-hand position 17' until the component 24 has entered the guideway 42 of the discharge rail 13 or has left this. To speed up picking, the conveyor unit 17 may be shifted into this right-hand position 17' directly after the movement of the component 24 into the guideway 41 of the rail 12, i.e. already in the step in the procedure as evident from FIG. 4.

The conveyor unit 17 is higher on the side of the window 27 than on the side opposite thereto. This difference in height produces a more or less steplike configuration of the conveyor unit 17 acting as a tolerance compensation. The higher side is always travelled only up to the guideway 37 of the feed rail 11, but not under it. The opposite side of the conveyor unit 17 is less high and is travelled directly under the guideway 37. It is by means of this stepped configuration that components 24, 25, 26 can be processed, as long as their height is between the heights of the two sides of the conveyor unit 17, thus enabling minor departures in the dimensions of the components 24, 25, 26 to be compensated by this stepped conveyor unit 17.

The travel of the conveyor unit 18 is greater than the travel of the conveyor unit 17, as a result of which it is achieved that the contacting device 19 may be arranged relatively far removed from the feed rail 11 and the discharge rail 13, thus resulting in sufficient room for a probe (not shown) connected to the contacting device 19.

Should a component 24, 25, 26 become jammed in the guideway 37, window 27 or guideway 41 or window 28 the photocells 20, 21 and 22 respectively are no longer concealed. This lack of the component 24, 25, 26 is "seen" and signalled to a host control. This control then triggers a warning signal to alert an operator or it instigates suitable steps by itself.

Referring now to FIGS. 8 to 10 there is illustrated in more detail the feed rail 11. The feed rail 11 comprises an upper part 30 and a lower part 31. The upper part 30 is connected via a joint 32 to a fastener portion 33 which is fixed to the lower part 31 by means of screws 34, thus resulting in the upper part 30 being movable to a slight degree in the direction of the arrow 15, 16. For impacting, a cylinder 35 and a piston 36 in contact with the upper part 30 is provided. In the direction of the arrow 15 the upper part 30 is pretensioned via compression spring 39. A setscrew 38 serves as the stop and zero-point. When the cylinder 35 receives a supply of compressed air the piston 36 is shifted in the direction of the arrow 16, pivoting the upper part 30 in the direction of the arrow 16 and urging it against the lower part 31. The guideway 37 is reduced. As soon as the cylinder 35 is relieved of pressure the upper part 30 is removed from the lower part 31 by the action of the compression spring 39 in the direction of the arrow 15. This movement of the upper part 30 in the direction of the arrow 15 is defined by the setscrew 38. The maximum size of the guideway 37 can thus be set by means of the setscrew 38.

Urging the upper part 30 towards the lower part 31 reduces the size of the guideway 37 and remedies tilting or backups of the components 24, 25, 26 in the guideway 37 of the feed rail 11. Preferably, urging is undertaken periodically to preclude tilting or backups right from the start. As an alternative or in addition thereto this urging may be triggered by a host control as soon as the photocells 20 signal the lack of a component 24, 25, 26. It is in this way that backups in the feed rail 11 may be automatically remedied, as a rule.

Conveying the components 24, 25, 26 in the guideway 37 may be influenced by air nozzles 40, As a rule, air nozzles 40 support the movement of components in the conveying direction 39. As an alternative or in addition thereto, air nozzles 40 for decelerating the components may be provided to counteract this movement.

The picker 10 in accordance with the invention permits speedy and reliable picking of even miniature components 24, 25, 26 prior to testing integrated electronic circuits. This is achieved by using a fixed feed rail 11 together with the shiftable conveyor units 17, 18, this simultaneously reducing the mass moved. Furthermore, a tester may be used, configured relatively large.

What is claimed is:

1. A picker for electronic components, said picker comprising:
    a feed rail for accommodating a plurality of components arranged juxtaposed in a row, wherein said feed rail is arranged so as to be fixed;
    a first conveyor unit arranged at an exit opening of the feed rail and perpendicularly shiftable relative to said feed rail;

said first conveyor unit having a window suitable for receiving a single component of said plurality of components, said single component being shiftable together with said first conveyer unit when received in said window;

an impact-controllable stop provided in said feed rail upstream of said first conveyor unit for arresting components accomodated in the feed rail, wherein the spacing between said stop and an end of said feed rail facing said first conveyor unit is substantially twice the overall length of one component;

a second conveyor unit having a window suitable for receiving a single component of said plurality of components, wherein said second conveyor unit is provided downstream of said first conveyor unit and capable of being travelled parallel to said first conveyor unit; and a rail for guiding said components between said first conveyor unit and said second conveyor unit, wherein said rail is provided offset from the feed rail between said first conveyor unit and said second conveyor unit.

2. The picker as set forth in claim 1, wherein the conveyor unit comprises a first side and a second side, said first side being higher than said second side so as to accommodate variations in the dimensions of said components.

3. The picker as set forth in claim 1, wherein a contacting device is provided with which a component held in the second conveyor unit is connectable for testing.

4. The picker as set forth in claim 1, wherein the travel of the second conveyor unit is greater than the travel of the first conveyor unit.

5. The picker as set forth in claim 1, wherein a ramp is provided along the travel of the second conveyor unit for aligning a component accommodated in the second conveyor unit.

6. The picker as set forth in claim 1, wherein a discharge rail for receiving and guiding the picked components is provided downstream of the second conveyor unit, said discharge rail being in line with the feed rail.

7. The picker as set forth in claim 1, wherein at least one photocell is provided for sequence control and sensing the presence of a component.

8. The picker as set forth in claim 7, wherein each photocell is arranged on a fixed part of the picker.

9. The picker as set forth in claim 1, wherein the feed rail comprises an upper part and a lower part, the spacing between upper part and lower part being variable by means of a signal-controllable positioner.

10. The picker as set forth in claim 1, wherein one or more air nozzles are provided for conveying the components.

11. The picker as set forth in claim 1, wherein the picker further comprises a device for testing the components subsequent to picking.

12. A picker for electronic components, said picker comprising:

a feed rail for accomodating a plurality of components arranged juxtaposed in a row, wherein said feed rail is arranged so as to be fixed;

a first conveyor unit arranged at an exit opening of the feed rail and perpendicularly shiftable relative to said feed rail;

said first conveyor unit having a window suitable for receiving a single component of said plurality of components, said single component being shiftable together with said first conveyor unit when received in said window;

an impact-controllable stop provided in said feed rail upstream of said first conveyor unit for arresting components accomodated in the feed rail, wherein the spacing between said stop and an end of said feed rail facing said first conveyor unit is substantially twice the overall length of one component;

a second conveyor unit having a window suitable for receiving a single component of said plurality of components, wherein said second conveyor unit is provided downstream of said first conveyor unit and capable of being travelled parallel to said first conveyor unit; and wherein a contacting device is provided with which a component held in the second conveyor unit is connectable for testing.

13. A picker for electronic components, said picker comprising:

a feed rail for accomodating a plurality of components arranged juxtaposed in a row, wherein said feed rail is arranged so as to be fixed;

a first conveyor unit arranged at an exit opening of the feed rail and perpendicularly shiftable relative to said feed rail;

said first conveyor unit having a window suitable for receiving a single component of said plurality of components, said single component being shiftable together with said first conveyor unit when received in said window;

an impact-controllable stop provided in said feed rail upstream of said first conveyor unit for arresting components accomodated in the feed rail, wherein the spacing between said stop and an end of said feed rail facing said first conveyor unit is substantially twice the overall length of one component;

a second conveyor unit having a window suitable for receiving a single component of said plurality of components, wherein said second conveyor unit is provided downstream of said first conveyor unit and is capable of being travelled parallel to said first conveyor unit; and wherein a ramp is provided along the travel of the second conveyor unit for aligning a component accommodated in the second conveyor unit.

* * * * *